(12) United States Patent
Naruse et al.

(10) Patent No.: US 7,199,468 B2
(45) Date of Patent: Apr. 3, 2007

(54) HYBRID INTEGRATED CIRCUIT DEVICE WITH HIGH MELTING POINT BRAZING MATERIAL

(75) Inventors: Toshimichi Naruse, Gunma (JP); Nobuhisa Takakusaki, Gunma (JP); Hajime Kobayashi, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 203 days.

(21) Appl. No.: 10/813,189

(22) Filed: Mar. 29, 2004

(65) Prior Publication Data
US 2004/0262644 A1 Dec. 30, 2004

(30) Foreign Application Priority Data
Jun. 30, 2003 (JP) ............................ 2003-188523

(51) Int. Cl.
*H01L 23/34* (2006.01)
(52) U.S. Cl. ...................................... 257/723; 257/724
(58) Field of Classification Search ................ 257/723, 257/724, 728
See application file for complete search history.

(56) References Cited

U.S. PATENT DOCUMENTS 6,889,431 B2 * 5/2005 Okabe et al. ................. 29/847

FOREIGN PATENT DOCUMENTS

JP   2003-007921   1/2003
KR   2002-96985   12/2002

* cited by examiner

*Primary Examiner*—Hoai Pham
(74) *Attorney, Agent, or Firm*—Fish & Richardson P.C.

(57) ABSTRACT

In order to prevent short-circuiting when a chip component is brazed to pads of a conductive wiring layer, a hybrid semiconductor circuit includes the chip component with terminal electrodes formed at both ends, a first conductive wiring layer on which the pads are provided such that they correspond to the terminal electrodes, and an overcoat resin that covers the first conductive wiring layer excluding the pads. The terminal electrodes of the chip component are adhered to the pads by a conductive adhesive and an insulating adhesive is provided between the pads.

1 Claim, 10 Drawing Sheets

HYBRID INTEGRATED CIRCUIT DEVICE WITH HIGH MELTING POINT BRAZING MATERIAL

BACKGROUND OF THE INVENTION

1. Field of the invention

This invention relates to a hybrid integrated circuit in which terminal electrodes of a chip component are attached to pads formed in conductive wiring layers.

2. Description of the Related Art

Recently, downsizing, low-profiling, and reduction in weight have been increasingly demanded in chip components used in electronic apparatuses such as portable computers or printers. Therefore, a packaged semiconductor integrated circuit by, as a chip component, attaching a semiconductor element to a substrate and molding the substrate by an insulating resin exists.

FIG. 18 is a related-art packaged semiconductor integrated circuit. For a packaged semiconductor integrated circuit, a bare chip 3 of an LSI or the like is attached to a die pad 1 via a brazing material 2, and electrodes (unillustrated) of the bare chip 3 and lead terminals 5 are connected by thin metal wires 6.

And, the surroundings of the die pad 1 and the bare chip 3 are covered by an insulating resin layer 9. In the aforementioned packaged semiconductor integrated circuit, the lead terminals 5 are attached, by a brazing material 4, to a printed wiring 8 printed on a mounting substrate 7.

In this packaged semiconductor integrated circuit, since the lead terminals 5 are exposed to the outside from the insulating resin layer 9, soldering is easy. However, the mounting size of the whole is great, therein exists a difficulty in downsizing, low-profiling, and reduction in weight.

FIG. 19 and FIG. 20 are a plan view and a sectional view of a hybrid integrated circuit as an improvement of the aforementioned packaged semiconductor integrated circuit.

A bare chip 10 of an LSI or the like is attached to a die pad 12 formed on a conductive wiring layer 11. In addition, electrodes 14 provided at both ends of a chip capacitor 13 are directly brazed to pads 15 formed on a conductive wiring layer 11.

Next, an electrode 16 of the bare chip 10 of an LSI or the like the pads 15 are connected by a thin metal wire 17.

As shown in FIG. 20A, although the upper part of the conductive wiring layer 11 is electrically isolated by isolation grooves 18, the lower part of the conductive wiring layer 11 is still connected.

The conductive wiring layer 11 and bare chip 10 and thin metal wires 17 are entirely covered by an insulating resin 24. Thereafter, a continuous part of the lower part of the conductive wiring layer 11 and the insulating resin 24 is cut together as shown by an alternate long and short dashed line, whereby the conductive wiring layer 11 is completely electrically isolated.

As in FIG. 20B, the undersurface of the conductive wiring layer 11 is exposed through the insulating resin 24. On exposed parts of the conductive wiring layer 11, for electrical connection to the outside, external electrodes 19 are formed by providing a brazing material such as a solder. Furthermore, the positions where the external electrodes are provided are covered by a resist 20 for the purpose of protecting the conductive wiring layer.

FIG. 21 is an enlarged view showing a main part of a hybrid integrated circuit. The terminal electrodes 14 of the chip capacitor 13 are fixedly fitted to the pads 15 formed on the conductive wiring layer 11 by a brazing material 21.

External electrodes 14 of the chip capacitor 13 to form a hybrid integrated circuit are attached, by a brazing material 21, to the pads 15 formed on conductive wiring layer 11.

As shown in FIG. 22, external electrodes 19 of a hybrid integrated circuit are heated to be attached to a wiring 23 of a a board 22. When these are heated, the heat is transmitted to the pads 15, whereby a brazing material 21 which attaches the terminal electrodes 14 to the pads 15 is melted, causing a short-circuit between the pads 15.

In addition, it can be considered that the terminal electrodes 14 and pads 15 are attached by a brazing material with a higher melting point than that of the brazing material 21 to form the external electrodes 21.

However, plating applied to the terminal electrodes 14 contains tin. When the aforementioned heat is transmitted to the terminal electrodes 14, the tin contained in the plating is melted and is melted into the brazing material 21, whereby the melting point of the brazing material 21 is lowered. Therefore, even when a high-melting-point brazing material is used as a brazing material 21, the brazing material 21 is melted, causing a short-circuit between the pads 15.

Furthermore, it can be considered that the terminal electrodes 14 and the pads 15 are attached by use of a conductive adhesive. When the terminal electrodes 14 and the pads 15 are attached by a conductive adhesive, if the conductive adhesive is excessive, this flows out to cause a short-circuit between the pads 15 In addition, when the external electrodes 21 are heated to be attached to the wiring 23 of the board 22, adhesive force of the conductive adhesive is deteriorated and adhesion between the terminal electrodes 14 and the pads 15 becomes insufficient.

SUMMARY OF THE INVENTION

The present embodiment has been made to allow the terminal clectrodes of a chip component to be satisfactorily attached to the pads formed in conductive wiring layers, and The present embodiment provides a hybrid integrated circuit provided with: a chip component with terminal electrodes formed at both ends, a conductive wiring layers in which a plurality of pads are provided in a manner corresponding to the terminal electrodes, an overcoat resin for covering the conductive wiring layers excluding the pads, and external electrodes which are electrically connected to the conductive wiring layer, wherein a space portion is provided in the overcoat resin between the pads where the terminal electrodes of the chip component are attached by a brazing material.

The present embodiment provides a hybrid integrated circuit provided with: a chip component with terminal electrodes formed at both ends, conductive wiring layers in which plurality of pads are provided in a manner corresponding to the terminal electrodes, an overcoat resin for covering the conductive wiring layers excluding the pads, and external electrodes made of a brazing material so as to be electrically connected to the conductive wiring layers, wherein an insulating resin is provided between the pads where the terminal electrodes of the chip component are attached by a brazing material.

The present embodiment provides a hybrid integrated circuit provided with: a chip component with terminal electrodes formed at both ends, conductive wiring layers in which a plurality of pads are provided in a manner corresponding to the terminal electrodes, an overcoat resin for covering the conductive layer excluding the pads, and external electrodes made of a brazing material so as to be electrically connected to the conductive wiring layer, wherein a plating containing no tin is applied to the terminal electrodes of the chip component, and a brazing material to adhere the terminal electrodes to the pads is attached as a brazing material with a higher melting point than that of the brazing material to form the external electrodes.

The present embodiment provides a hybrid integrated circuit provided with: a chip component with terminal electrodes formed at both ends, conductive wiring layers in which a plurality of pads are provided in a manner corresponding to the terminal electrodes, and an overcoat resin for covering the conductive wiring layers excluding the pads, wherein a conductive adhesive is provided on the pads, an insulating adhesive is provided between the pads, the chip component body is adhered to the overcoat resin by the insulating adhesive, and the terminal electrodes of the chip component are adhered to the pads by the conductive adhesive.

In a hybrid integrated circuit of the preferred embodiments, a space portion surrounded by a resin is provided between the pads formed in the conductive wiring layers. And, heat to attach the external electrodes of the hybrid integrated circuit to the printed board is transmitted to the pads. At this time, even when a brazing material which has fixedly fitted the terminal electrodes of the chip component and pads melts and flows out, this flows into the space portion, whereby a short-circuit between the pads by the brazing material can be prevented.

In addition, in a hybrid integrated circuit of the preferred embodiments, an insulating resin is provided between the pads formed in the conductive wiring layers. And, similar to the above, heat to attach the external electrodes of the hybrid integrated circuit to the printed board is transmitted to the pads. At this time, even when a brazing material which has fixedly fitted the terminal electrodes of the chip component and pads melts and flows out, this is hampered by the insulating resin, whereby a short-circuit between the pads by the brazing material can be prevented.

In addition, in a hybrid integrated circuit of the preferred embodiments, the terminal electrodes of the chip component and pads are fixedly fitted by means of a brazing material with a higher melting point than that of the brazing material to fixedly fit the external electrodes to the printed wiring. And, since a plating containing no tin is used for the terminal electrodes of the chip component, even when heat is transmitted to the terminal electrodes and the plating is melted, the melting point of the high-melting point brazing material is never lowered.

In addition, in a hybrid integrated circuit of the preferred embodiments, the terminal electrodes of the chip component are attached to the pads by means of a conductive adhesive. And, since an insulating adhesive has been provided between these pads, the conductive adhesive is hampered by the insulating adhesive even when the conductive adhesive is excessive and flows out, whereby a short-circuit between the pads can be prevented. Moreover, even when the conductive force of the conductive adhesive is deteriorated by the heat to attach the external electrodes to the printed wiring of the printed board, the adhesive force of the chip component itself is maintained by the adhesive force of the insulating adhesive.

BRIEF DESCRIPTION OF THE DRAWINGS

FIG. 20 are sectional views of a related-art hybrid integrated circuit, wherein

DESCRIPTION OF THE PREFERRED EMBODIMENTS

A hybrid integrated circuit of the present embodiment will be described in detail according to FIG. 1 to FIG. 17.

Figure 1:
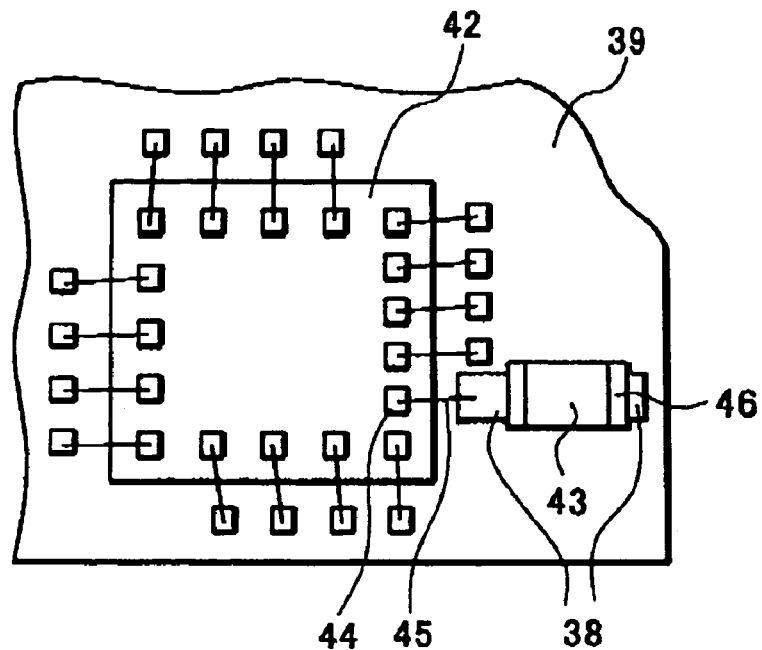
FIG. 1 is a plan view of a hybrid integrated circuit of the present embodiments.
Figure 2:
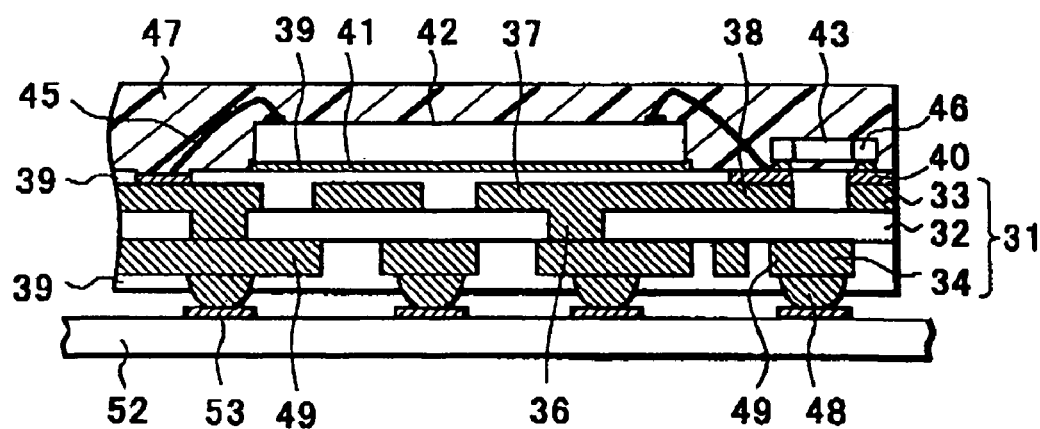
FIG. 2 is a sectional view of a hybrid integrated circuit of the present embodiments.

FIG. 1 and FIG. 2 are a plan view and a sectional view of a hybrid integrated circuit of the present embodiment. A sheet 31 is composed of a first conductive film 33 and a second conductive film 34 adhered to an insulating resin film 32. The first conductive film 33 and the second conductive film 34 are connected by multi-layered connection means 36. The first conductive film 33 is etched into a desirable pattern to form a first conductive wiring layer 37, and a semiconductor circuit element 42 and a chip component 43 are attached thereto.

The semiconductor circuit element 42 is a bare chip of an LSI or IC, and the chip component 43 is a circuit element such as a chip capacitor or a chip resistor.

The first conductive wiring layer 37, the semiconductor circuit element 42, and chip component 43 are covered by a sealing resin layer 47. In addition, the second conductive film 34 is etched into a desirable pattern to form a second conductive wiring layer 49. And, external electrodes 48 made of a brazing material are formed at desirable positions of the second conductive wiring layer 49.

The semiconductor circuit element 42 is attached to a die pad 41 formed on an overcoat resin 39. In addition, electrodes 46 provided at both ends of the chip component 43 are brazed to the upper surfaces of the pads 38 formed in the first conductive wiring layer 37. Herein, in the present embodiment, a plating film 40 is formed on the surfaces of the pads 38.

Next, electrode pads 44 and the pad 38 of the semiconductor circuit element 42 are connected by thin metal wires 45.

A manufacturing method of the aforementioned hybrid integrated circuit will be described in FIG. 3 to FIG. 10.

Figure 3:
FIG. 3 is a sectional view showing a manufacturing method of a hybrid integrated circuit of the present embodiments.

As shown in FIG. 3, the first conductive film 33 and the second conductive film 34 are adhered by an insulating resin film 32 to form a sheet 31.

Figure 4:
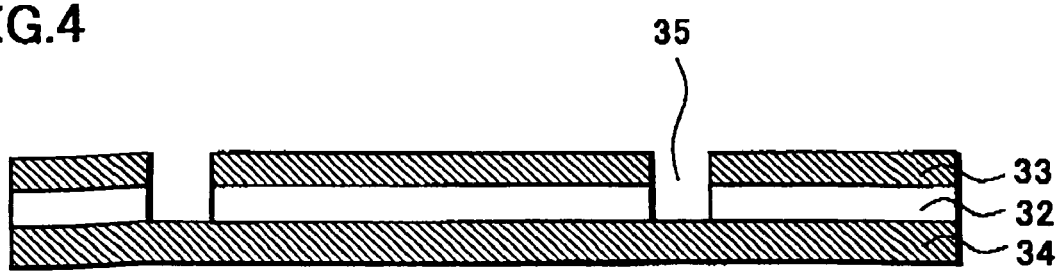
FIG. 4 is a sectional view showing a manufacturing method of a hybrid integrated circuit of the present embodiments.

Next, as shown in FIG. 4, a through hole 35 is formed through the first conductive film 33 and insulating resin film 32 in a desirable position of the sheet 31, whereby the second conductive conductive film 34 is selectively exposed.

Figure 5:
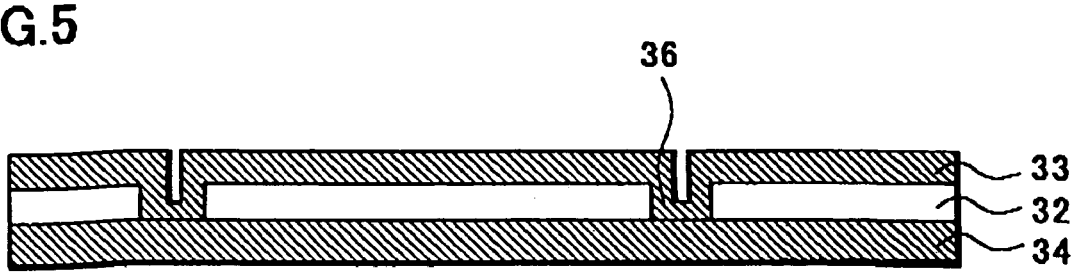
FIG. 5 is a sectional view showing a manufacturing method of a hybrid integrated circuit of the present embodiments.

As shown in FIG. 5, multi-layered connection means 36 are formed within the through hole 35, whereby the first conductive film 33 and the second conductive film 34 are electrically connected.

Figure 6:
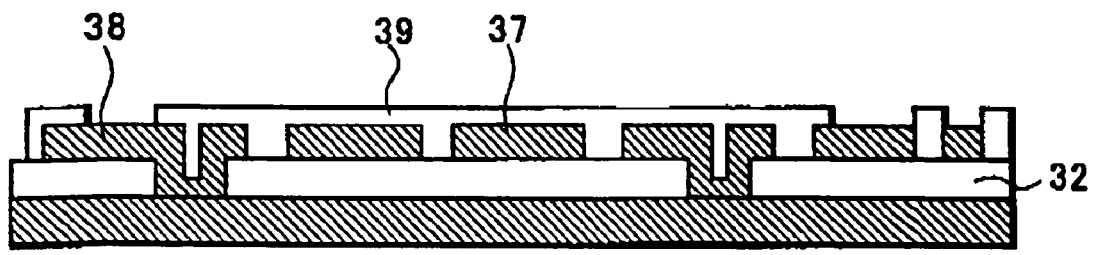
FIG. 6 is a sectional view showing a manufacturing method of a hybrid integrated circuit of the present embodiments.
Figure 7:
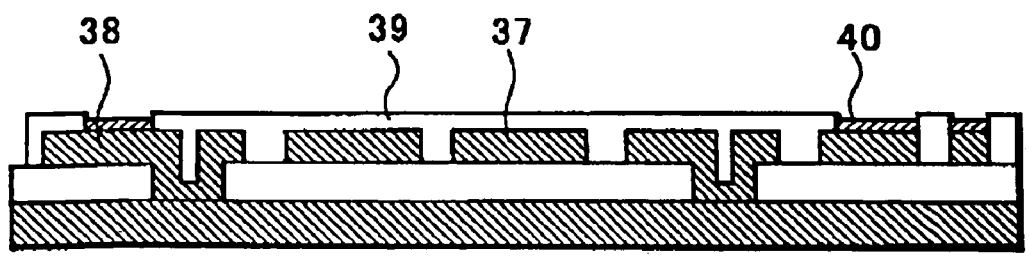
FIG. 7 is a sectional view showing a manufacturing method of a hybrid integrated circuit of the present embodiments.

Furthermore, as shown in FIG. 6 and FIG. 7, the first conductive film 33 is etched into a desirable pattern to form the first conductive wiring layer 37 and the pads 38.

Subsequently, in order to expose the pads 38, other parts are covered by the overcoat resin 39.

As shown in FIG. 7, the plating film 40 such as Au or Ag is formed on the pads 38 in consideration of bonding characteristics.

Figure 8:
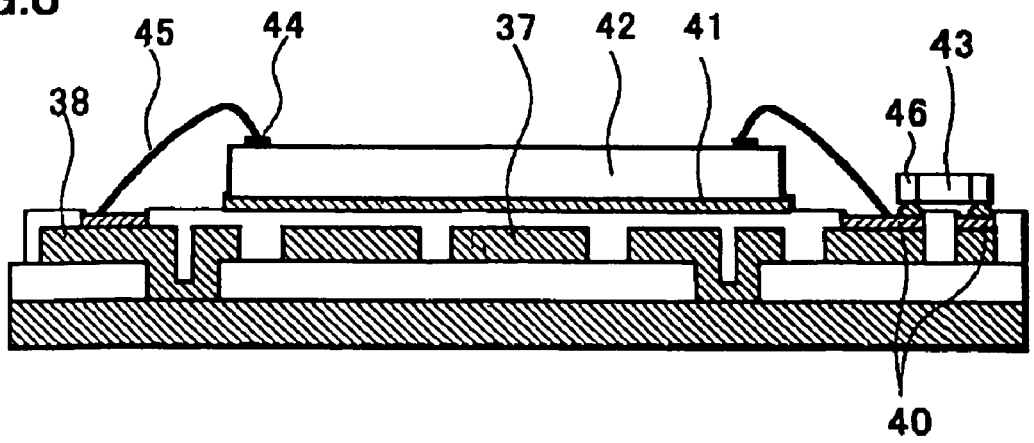
FIG. 8 is a sectional view showing a manufacturing method of a hybrid integrated circuit of the present embodiments.

As shown in FIG. 8, the top of the first conductive wiring layer 37 is electrically insulated by the overcoat resin 39, and the semiconductor circuit element 42 and the chip component 43 are attached to the die pad 41 and the pads 38. Respective the electrode pads 44 and pads 38 of the semiconductor circuit element 42 are connected by thin metal wires 45. In addition, the terminal electrodes 46 of the chip components 43 are attached to the upper surfaces of the pads 38.

Figure 9:
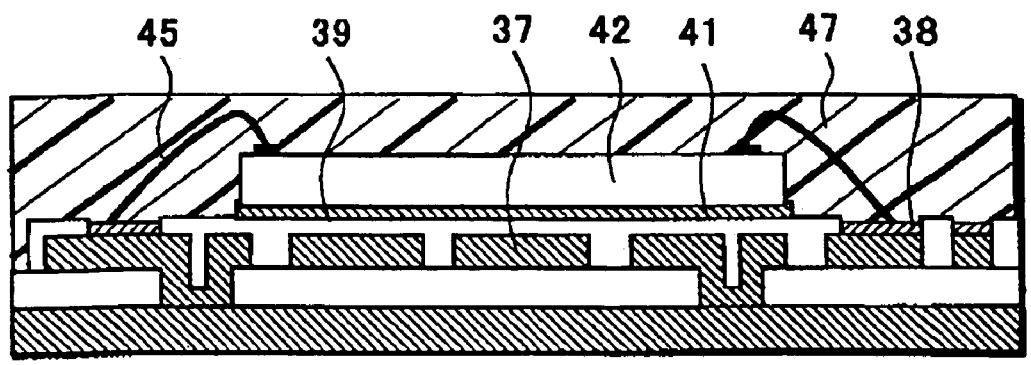
FIG. 9 is a sectional view showing a manufacturing method of a hybrid integrated circuit of the present embodiments.

As shown in FIG. 9, the first conductive wiring layer 37 and the semiconductor circuit element 42, etc., are sealed by a sealing resin layer 47.

Figure 10:
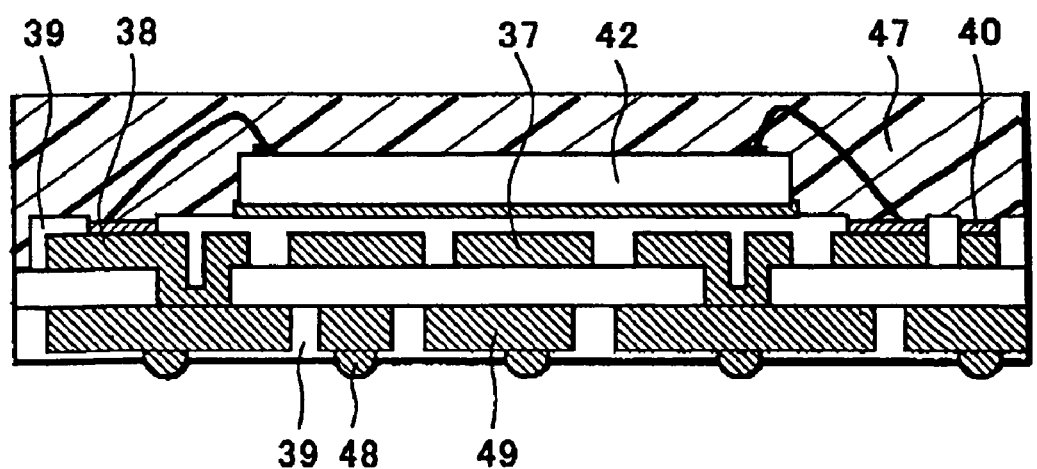
FIG. 10 is a sectional view showing a manufacturing method of a hybrid integrated circuit of the present embodiments.

As shown in FIG. 10, the second conductive film 34 is etched into a desirable pattern to form the second conductive wiring layer 49. Thereafter, excluding parts to be the external electrodes 48 formed of a brazing material, the second conductive wiring layer 49 is covered by the overcoat resin 39, thus a hybrid integrated circuit is constructed.

Figure 11:
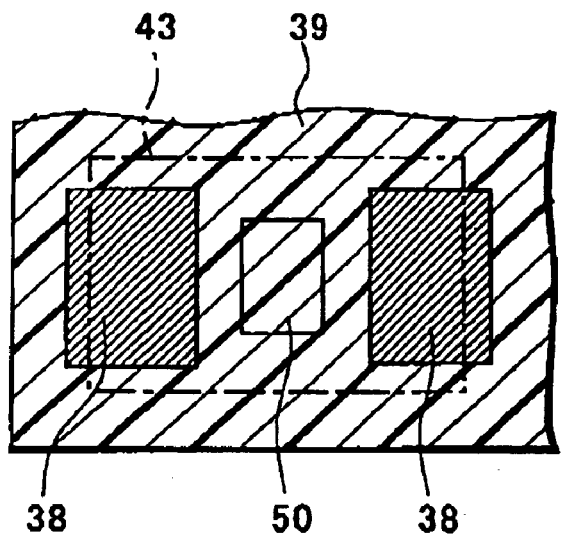
FIG. 11 is a plan view showing a main part of a hybrid integrated circuit of the present embodiments.
Figure 12:
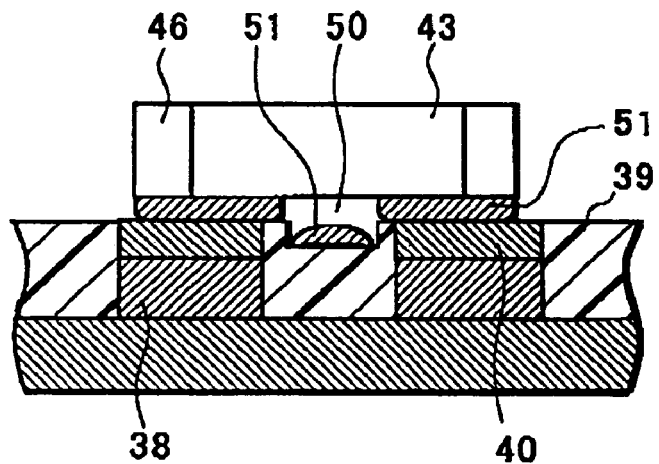
FIG. 12 is a sectional view showing a main part of a hybrid integrated circuit of the present embodiments.

FIG. 11 and FIG. 12 are a plan view and a sectional view of a main part showing characteristics of a hybrid integrated circuit of the present embodiment. The aforementioned the chip component 43 is an electrical component such as a chip capacitor or a chip resistor, and has plated the terminal electrodes 46 at both ends thereof.

In addition, in the first conductive wiring layer 37, as mentioned above, the pads 38 are formed in a manner corresponding to the terminal electrodes 46. And, a space portion 50 to release a brazing material 51 is formed between the pads 38. Accordingly, the surrounding of the space portion 50 is surrounded by the overcoat resin 39. Although the space portion 50 is 0.23 cm wide and 0.10 cm long, the size is different depending on the chip component 43 to be attached.

As shown in FIG. 12, the terminal electrodes 46 are attached to the pads 38 prior to sealing by a sealing resin. For an attachment, by applying a brazing material 51 such as a solder to the pads 38 in advance, and placing and heating the terminal electrodes 46, the brazing material 51 is fused so that the terminal electrodes 46 are attached to the pads 38.

The hybrid integrated circuit shown in FIG. 2 is used by a user by incorporating the same into a printed wiring board 52 used in an electronic apparatus. For this, the external electrodes 48 of the hybrid integrated circuit are placed on the printed wiring 53 of the printed wiring board 52 and heated. Since the external electrodes 48 are formed of a brazing material such as a solder, the brazing material is melted, whereby the hybrid integrated circuit is attached to the printed wiring 53.

At the time of heating for an attachment as mentioned above, the heat is transmitted from the second conductive wiring layer 49 through the first conductive wiring layer 37 to the pads 38. And, it is likely that the brazing material 51 which has attached the terminal electrodes 46 and the pads 38 is melted to cause a short-circuit between the pads 38. However, in the present embodiment, since the space portion 50 surrounded by the overcoat resin 39 is provided between the pads 38, the flowed out the brazing material 51 flows into the space portion 50 to prevent a short-circuit between the pads 38.

Figure 13:
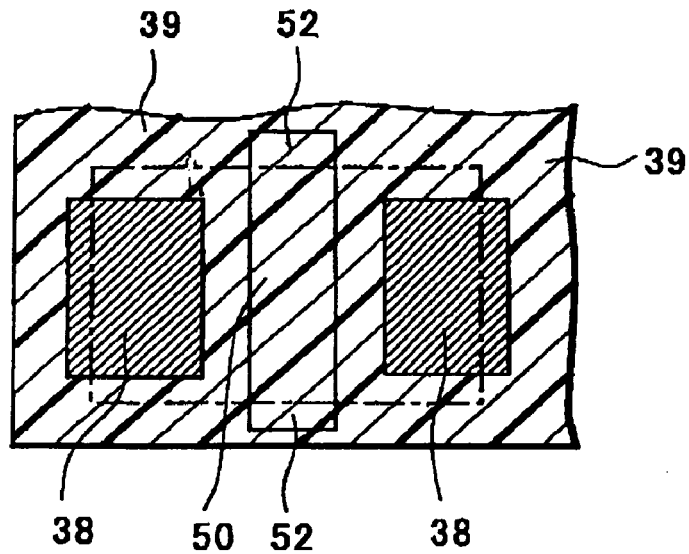
FIG. 13 is a sectional view showing a main part of a hybrid integrated circuit of the present embodiments.

FIG. 13 is a plan view for explaining another example of a hybrid integrated circuit of the present embodiment.

This is similar to FIG. 11 and FIG. 12 in the pads 38 are provided on the first conductive wiring layer 37. However, the space portion 50, which is formed between the pads 38 and releases the brazing material 51, is provided with the extensions 54 which extend further outside than the side surfaces of the chip component 43 attached to the pads 38. Herein, similar to the above, the surrounding of the space portion 50 is surrounded by the overcoat resin 39 applied to the surface of the first conductive wiring layer 37.

The space portion 50 is, similar to the above, 0.16 cm long, but this has the extension 54 protruded outside by 0.15 cm from the pads 38. In addition, although the space portion 50 is 0.10 cm long, thereon the extension 54 protruded outside by 0.15 cm from the pads 38 is provided. The length of the space portion 50 and the length of the extension 54 are different depending on the chip component to be attached.

After the external electrodes 48 of the hybrid integrated circuit are joined to the printed wiring 53 provided on a printed wiring borad 52, these are heated. By heating, the external electrodes 48 formed of a brazing material are fused so that the hybrid integrated circuit is attached to the pads 38.

As mentioned above, heat is transmitted from the second conductive wiring layer 49 through the first conductive wiring layer 37 to the pads 38. And, it is likely that the brazing material 51 which has attached the terminal electrode 46 and the pads 38 is melted to cause a short-circuit between the pads 38. However, in the present embodiment, since the space portion 50 surrounded by the overcoat resin 39 is provided between the pads 38, the flowed out the brazing material 51 flows into the space portion 50.

The brazing material 51 which has flowed into the space portion 50 is washed together with flux and removed from the extensions 54 positioned outside the side surfaces of the chip component 43. Accordingly, the flowed out the brazing material 51 never causes a short-circuit between the pads 38. Furthermore, the chip component 43 is firmly attached to the pads 38 by removing the flux.

Figure 14:
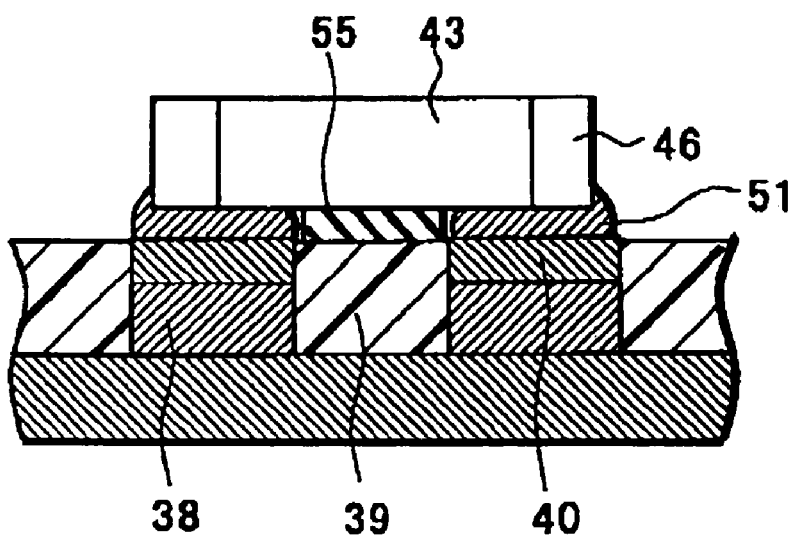
FIG. 14 is a sectional view showing a main part of a hybrid integrated circuit of the present embodiments.

FIG. 14 is a sectional view showing another example of a hybrid integrated circuit of the present embodiment. A difference from FIG. 12 is that no space portion 50 is formed and an underfill resin 55 is formed between the pads 38.

As shown in FIG. 2, after the external electrodes 48 of a hybrid integrated circuit are joined to the printed wiring 53 provided on the printed wiring board 52, these are heated. By heating, the external electrodes 48 formed of a brazing material are fused so that the hybrid integrated circuit is attached to the printed wiring 53.

As mentioned above, heat is transmitted from the second conductive wiring layer 49 through the first conductive wiring layer 37 to the pads 38. And, it is likely that the brazing material 51 which has attached terminal electrode 46 and the pads 38 is melted to cause a short-circuit between the pads 38. However, in the present embodiment, since the underfill resin 55 is provided between the pads 38, a flowed out brazing material 51 is hindered by the underfill resin 55, causing no short-circuit between the pads 38.

Figure 15:
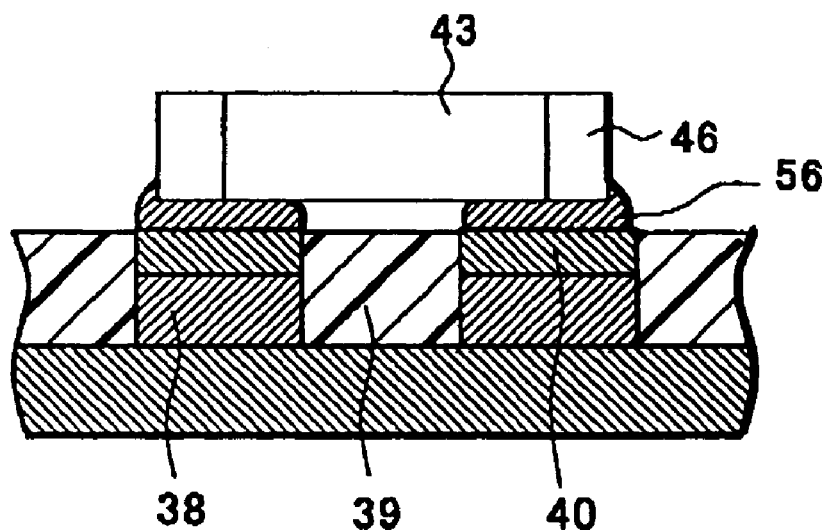
FIG. 15 is a sectional view showing a main part of a hybrid integrated circuit of the present embodiments.

FIG. 15 is a sectional view showing another example of a hybrid integrated circuit of the present embodiment. As the brazing material to attach the terminal electrodes 46 to the pads 38, a high-melting point brazing material 56 than that of the brazing material to form the external electrodes 48 is used. In actuality, for example, a high-melting point brazing material with a melting point of 300° C., which is formed of a composition of 5% Sn and 95% Pb is used. On the other hand, the brazing material to form the external electrodes 48 is a brazing material with a melting point of 238° C., which is formed of a composition of 3% Sn, 0.5% Ag, and 96.5% Pb.

The external electrodes 48 of the hybrid integrated circuit shown in FIG. 2 are heated to be joined to the printed wiring 53 provided on the printed wiring board 52. When these are heated to 238° C. or more, the brazing material to form the external electrodes 48 are fused so that the hybrid integrated circuit is attached to the printed wiring 53.

In addition, the heat is transmitted from the second conductive wiring layer 49 through the first conductive wiring layer 37 to the pads 38. And, when the terminal electrodes 46 and the pads 38 are heated, it is likely that the brazing material 51 is melted to cause a short-circuit between the pads 38. However, a high-melting point brazing material 56 to attach the pads 38 and chip component 43 does not reach its melting point and therefore never fuses.

Meanwhile, heat used for heating to attach the external electrodes 48 to the printed wiring 53 of the printed wiring board 52 is transmitted from the second conductive wiring layer 49 through the first conductive wiring layer 37 to the pads 38. Furthermore, the heat is transmitted to the terminal electrodes 46 and fuses Sn plated on the terminal electrodes 46. When the fused Sn is melted into the high-melting point brazing material 56, this lowers the melting point of the high-melting point brazing material 56. Accordingly, it is likely that the high-melting point brazing material 56 is lowered in its melting point and starts to melt.

In the present embodiment, the terminal electrodes 46 of the chip component 43 are formed by a gold plating or copper plating containing no Sn. Then, while heat used for heating to attach the external electrodes 48 to the printed wiring 53 of the printed wiring board 52 is transmitted from the second conductive layer 49 through the first conductive wiring layer 375 to the pads 38, no Sn is contained in the plating of the terminal electrodes 46. Therefore, the melting point of the high-melting point brazing material 56 is never lowered.

Figure 16:
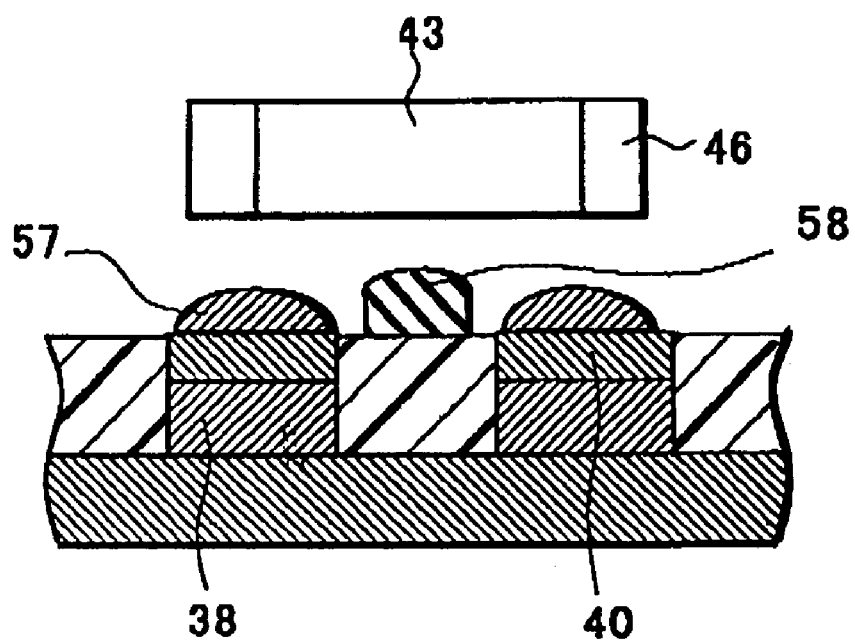
FIG. 16 is a sectional view showing a main part of a hybrid integrated circuit of the present embodiments.
Figure 17:
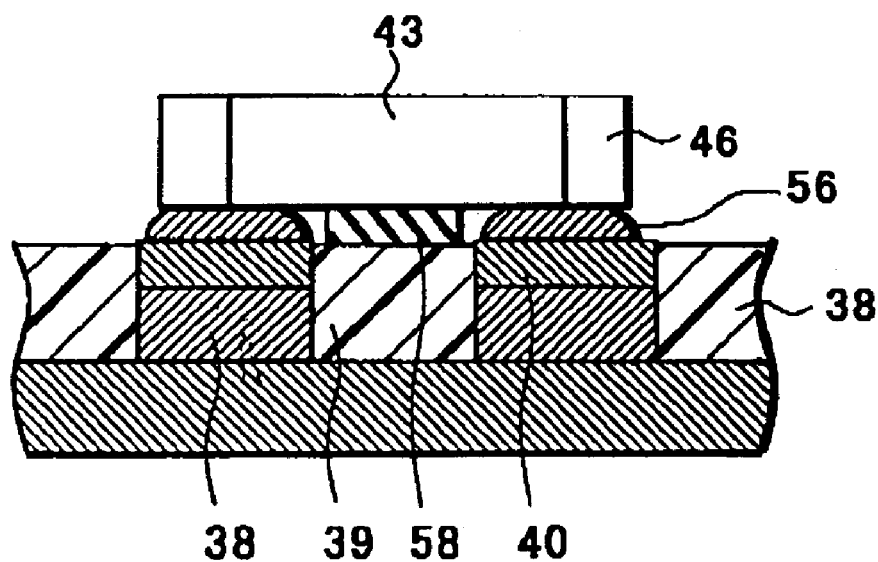
FIG. 17 is a sectional view showing a main part of a hybrid integrated circuit of the present embodiments.
Figure 18:
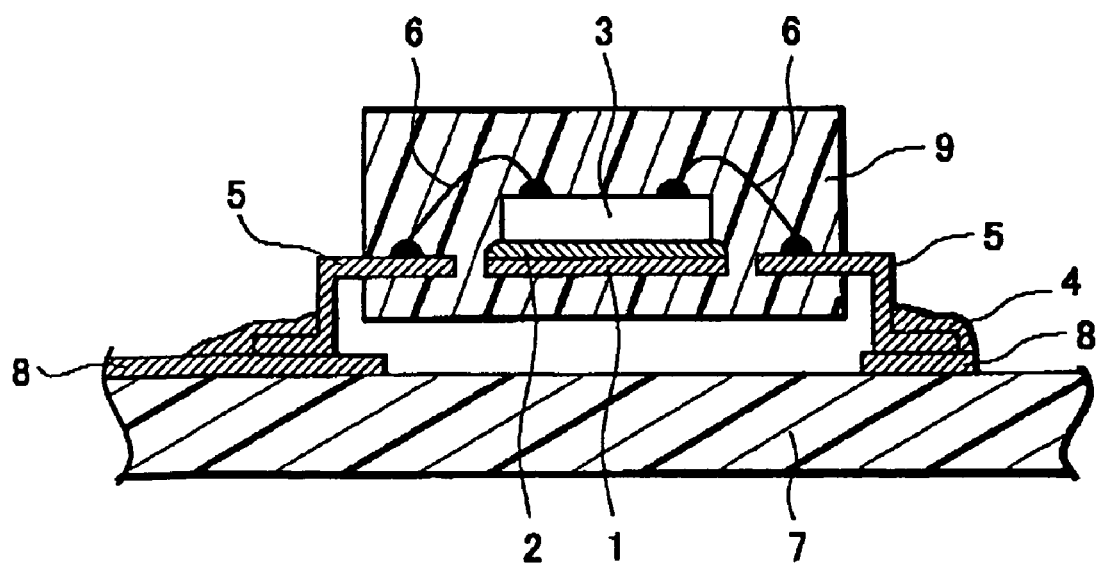
FIG. 18 is a sectional view showing a related-art hybrid integrated circuit.
Figure 19:
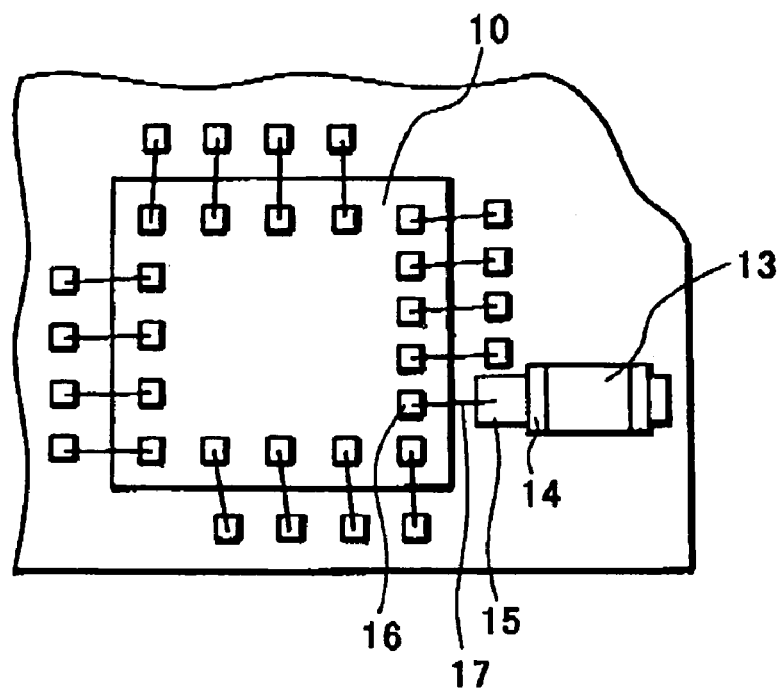
FIG. 19 is a sectional view showing a related-art hybrid integrated circuit.
Figure 20A:
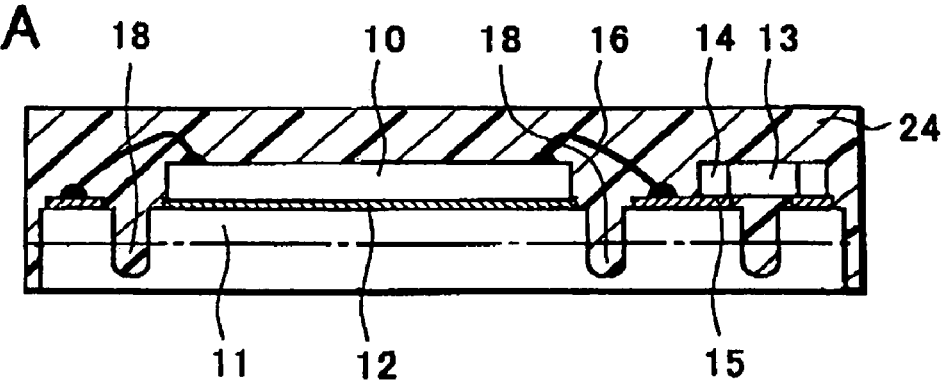
FIG. 20A is a sectional view showing manufacturing steps.
Figure 20B:
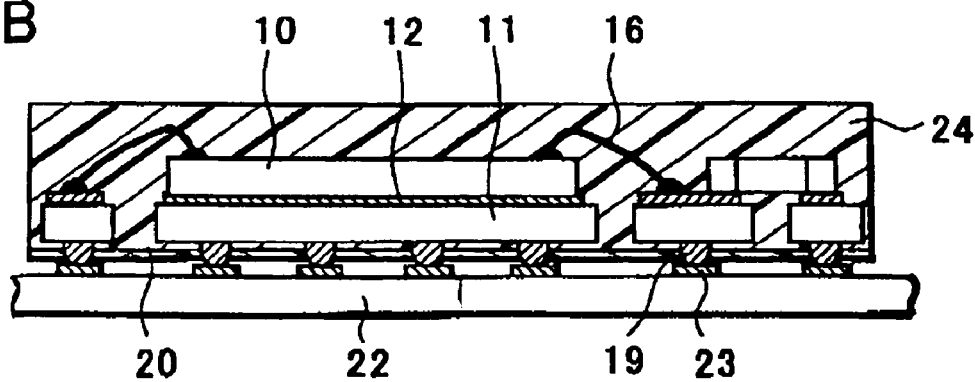
FIG. 20B is a sectional view after completion.
Figure 21:
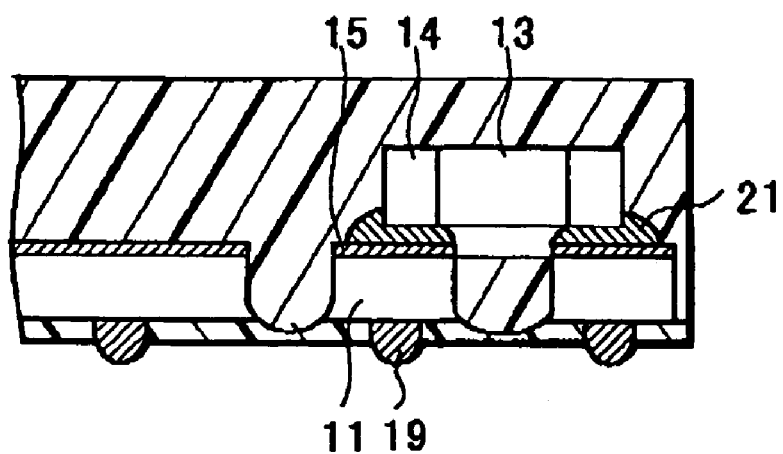
FIG. 21 is a sectional view showing a main part of a related-art hybrid integrated circuit.
Figure 22:
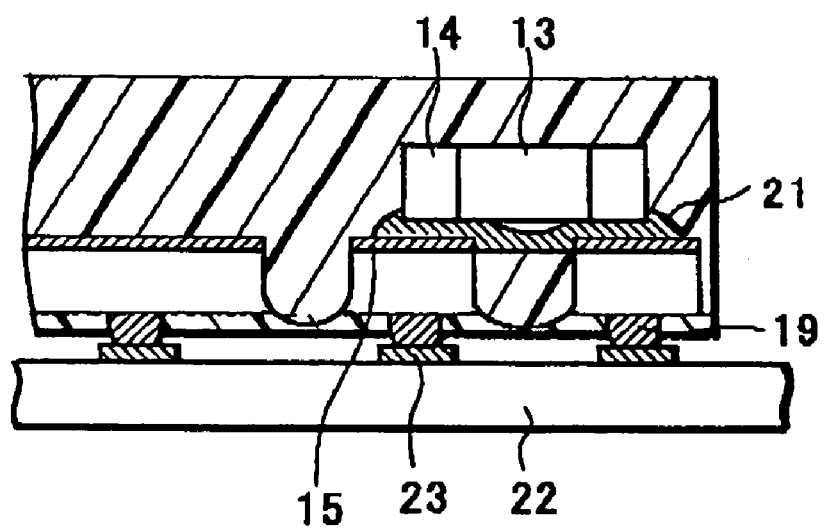
FIG. 22 is a sectional view showing a main part of a related-art hybrid integrated circuit.

FIG. 16 and FIG. 17 are sectional views showing another example of a hybrid integrated circuit of the present embodiment.

In the present example, the terminal electrodes 46 of a chip component 43 are adhered to the pads 38 by means of a conductive adhesive 57, for example, an Ag paste. However, the conductive adhesive 57, if the amount is large, sticks out to cause a short-circuit between the pads 38. In addition, when heat used for heating to attach the external electrodes 48 to printed wiring 53 is transmitted from the second conductive layer 49 through the first conductive wiring layer 37 to the pads 38, the conductive adhesive 57 is lowered in its adhesion by the heat.

Therefore, in the present embodiment, an insulating adhesive 58 is disposed between the conductive adhesives 57. And, the insulating adhesive 56 is disposed so that its upper surface is higher than that of the conductive adhesive 57. Accordingly, when the chip component 43 is placed so as to adhere the terminal electrodes 46 of the chip component 43 to the pads 38, first, the insulating adhesive 58 is made to contact with the chip component 43 of body.

Furthermore, when the chip component 43 is depressed, the conductive adhesives 57 is made to contact with the terminal electrodes 46, and the terminal electrodes 46 and the pads 38 are adhered. At this time, although the conductive adhesives 57 are pressed and spread, since the insulating adhesive 58 is already in contact with the chip component 43, the conductive adhesives 57 never cause a short-circuit between the pads 38.

In addition, heat used for heating to attach the external electrodes 48 to the printed wiring 53 is transmitted from the second conductive wiring layer 49 through the first conductive wiring layer 37 to the pads 38. However, since the chip component 43 has been adhered to the overcoat 339 by the insulating adhesive 58, deterioration in the adhesive force of the conductive adhesive 57 causes no influence.

What is claimed is:

1. A hybrid integrated circuit provided with:
   a chip component with terminal electrodes at both ends, wherein the terminal electrode do not contain tin;
   conductive wiring layers in which a plurality of pads are provided in a manner corresponding to the terminal electrodes;
   an overcoat resin for covering the conductive wiring layers excluding the pads;
   external electrodes comprising a first brazing material so as to be electrically connected to the conductive wiring layers; and
   a second brazing material to adhere the terminal electrodes to the pads, wherein the second brazing material has a higher melting point than that of the first brazing material of the external electrodes.

* * * * *